US012684763B2

(12) United States Patent
Kim et al.

(10) Patent No.: US 12,684,763 B2
(45) Date of Patent: Jul. 14, 2026

(54) SEMICONDUCTOR DEVICE INCLUDING TRANSISTOR

(71) Applicant: SK hynix Inc., Gyeonggi-do (KR)

(72) Inventors: Miri Kim, Gyeonggi-do (KR); Sei Yon Kim, Gyeonggi-do (KR); Min Chul Sung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 414 days.

(21) Appl. No.: 18/354,035

(22) Filed: Jul. 18, 2023

(65) Prior Publication Data

US 2024/0276709 A1 Aug. 15, 2024

(30) Foreign Application Priority Data

Feb. 13, 2023 (KR) ........................ 10-2023-0018810

(51) Int. Cl.
*H10B 12/00* (2023.01)
(52) U.S. Cl.
CPC ......... *H10B 12/482* (2023.02); *H10B 12/315* (2023.02); *H10B 12/485* (2023.02); *H10B 12/488* (2023.02)
(58) Field of Classification Search
CPC .. H10B 12/315; H10B 12/482; H10B 12/485; H10B 12/488; H10B 51/30; H10B 53/30; H10B 61/22; H10B 63/00; H10B 63/10; H10B 63/30; H10D 30/6755
See application file for complete search history.

(56) References Cited

U.S. PATENT DOCUMENTS

| | | | | |
|---|---|---|---|---|
| 2012/0168843 A1* | 7/2012 | Seo | ...................... | H10B 12/482 |
| | | | | 438/266 |
| 2024/0015981 A1* | 1/2024 | Lee | ........................ | H10B 51/30 |

FOREIGN PATENT DOCUMENTS

| | | |
|---|---|---|
| KR | 10-2005-0009714 A | 1/2005 |
| KR | 10-2005-0094118 A | 9/2005 |
| KR | 10-2021-0103585 A | 8/2021 |

* cited by examiner

*Primary Examiner* — Hoai V Pham
(74) *Attorney, Agent, or Firm* — IP & T GROUP LLP

(57) ABSTRACT

A semiconductor device includes: a substrate; a bit line positioned over the substrate and extending in a first direction; a first dielectric layer covering the bit line; a first channel layer positioned over the first dielectric layer; at least one word line positioned over the first channel layer and extending in a second direction crossing the first direction; a second dielectric layer at least filling a space between adjacent word lines; a first contact coupled to the bit line by penetrating the second dielectric layer, the first channel layer, and the first dielectric layer; a third dielectric layer positioned over the word line, the second dielectric layer, and the first contact; and a second contact coupled to the first channel layer by penetrating the third dielectric layer and the second dielectric layer.

20 Claims, 10 Drawing Sheets

SEMICONDUCTOR DEVICE INCLUDING TRANSISTOR

CROSS-REFERENCE TO RELATED APPLICATIONS

The present application claims priority of Korean Patent Application No. 10-2023-0018810, filed on Feb. 13, 2023, which is incorporated herein by reference in its entirety.

BACKGROUND

1. Field

Various embodiments of the present disclosure relate to a semiconductor technology, and more particularly, to a semiconductor device including transistors.

2. Description of the Related Art

Conventionally, amorphous silicon or polysilicon has been mainly used as a semiconductor layer of a semiconductor device, such as a transistor. Amorphous silicon has an advantage of securing uniform device characteristics through a relatively inexpensive and simple process, while having a disadvantage of low carrier mobility. Polysilicon may be obtained by crystallizing amorphous silicon and may have a relatively high carrier mobility compared to the amorphous silicon. However, when polysilicon is formed, it is required to perform a recrystallization process, and it is difficult to secure uniform device characteristics.

Recently, an oxide semiconductor has been proposed as a semiconductor material having a high carrier mobility, which is an advantage over polysilicon, and uniform device characteristics, which is an advantage over amorphous silicon.

SUMMARY

Embodiments of the present disclosure are directed to a semiconductor device capable of improving the degree of integration and securing operating characteristics of a transistor.

In accordance with one embodiment of the present disclosure, a semiconductor device includes: a substrate; a bit line positioned over the substrate and extending in a first direction; a first dielectric layer covering the bit line; a first channel layer positioned over the first dielectric layer; at least one word line positioned over the first channel layer and extending in a second direction crossing the first direction; a second dielectric layer at least filling a space between adjacent word lines; a first contact coupled to the bit line by penetrating the second dielectric layer, the first channel layer, and the first dielectric layer; a third dielectric layer positioned over the word line, the second dielectric layer, and the first contact; and a second contact coupled to the first channel layer by penetrating the third dielectric layer and the second dielectric layer.

In accordance with another embodiment of the present disclosure, a semiconductor device includes: a substrate; a bit line positioned over the substrate and extending in a first direction; a first dielectric layer covering the bit line; a first channel layer positioned over the first dielectric layer; at least one word line positioned over the first channel layer and extending in a second direction crossing the first direction; a second dielectric layer at least filling a space between adjacent word lines; a second channel layer positioned over the word line and the second dielectric layer; a first contact coupled to the bit line by penetrating the second channel layer, the second dielectric layer, the first channel layer, and the first dielectric layer; a third dielectric layer positioned over the second channel layer and the first contact; and a second contact coupled to the first channel layer by penetrating the third dielectric layer, the second channel layer, and the second dielectric layer.

DETAILED DESCRIPTION

Figure 1A:
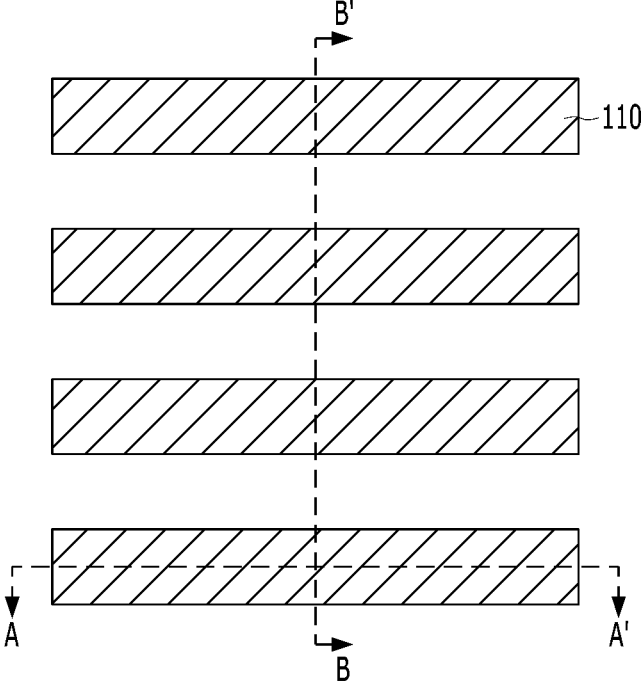
FIGS. 1A to 7B illustrate a semiconductor device and a method for fabricating the same in accordance with one embodiment of the present disclosure.

Various embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will convey the scope of the present disclosure to those skilled in the art. Throughout the disclosure, like reference numerals refer to like parts throughout the various figures and embodiments of the present disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but may also refer a case where a third layer exists between the first layer and the second layer or the substrate.

FIGS. 1A to 7B illustrate a semiconductor device and a method for fabricating the same in accordance with various embodiments of the present disclosure. FIGS. 1B, 2, 3, 4B, 5, 6B, and 7B show cross-sectional views, and FIGS. 1A, 4A, 6A, and 7A are plan views respectively corresponding to FIGS. 1B, 4B, 6B, and 7B. The cross-sectional views are taken along a line A-A' and a line B-B' of the plan views.

First, the fabrication method will be described.

Figure 1B:
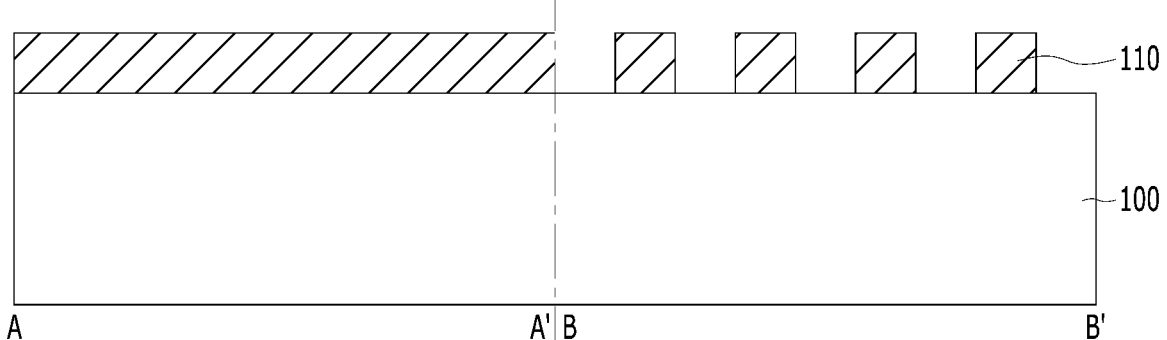

Referring to FIGS. 1A and 1B, a bit line 110 may be formed over a substrate 100.

The substrate 100 may include a semiconductor material, a dielectric material and the like.

The bit line 110 may extend in a direction parallel to the line A-A' shown in FIG. 1A, and a plurality of bit lines 110 may be arranged to be spaced apart from each other in a direction parallel to the line B-B' shown in FIG. 1A. Hereinafter, for the sake of convenience in description, the direction parallel to the line A-A' may be referred to as a first direction, and the direction parallel to the line B-B' may be referred to as a second direction. The first direction and the second direction may cross each other.

The bit line 110 may be formed by depositing a conductive material over the substrate 100 and then selectively etching the conductive material. The bit line 110 may include a metal-containing material, for example, a metal, an alloy, a metal compound and the like, such as for example aluminum (Al), titanium (Ti), chromium (Cr), cobalt (Co), nickel (Ni), copper (Cu), yttrium (Y), zirconium (Zr), ruthenium (Ru), silver (Ag), tantalum (Ta), tungsten (W) and the like, or a combination thereof.

Figure 2:
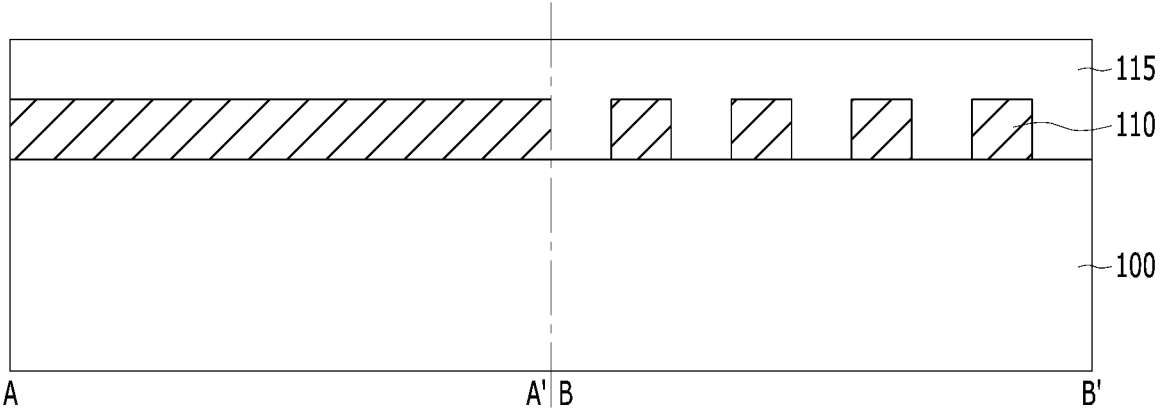

Referring to FIG. 2, a first dielectric layer 115 having a thickness that may sufficiently cover the bit line 110 while filling the space between the bit lines 110 may be formed over the substrate 100. In other words, the height of the top surface of the first dielectric layer 115 may be higher than the height of the top surface of the bit line 110.

The first dielectric layer 115 may include diverse dielectric materials, such as for example silicon oxide, silicon nitride, silicon oxynitride, or a combination thereof. Also, the first dielectric layer 115 may have a planarized top surface. In other words, the height of the top surface of the first dielectric layer 115 may be substantially constant. The first dielectric layer 115 may be formed by depositing a dielectric material and performing a planarization process, for example, Chemical Mechanical Polishing (CMP).

Figure 3:
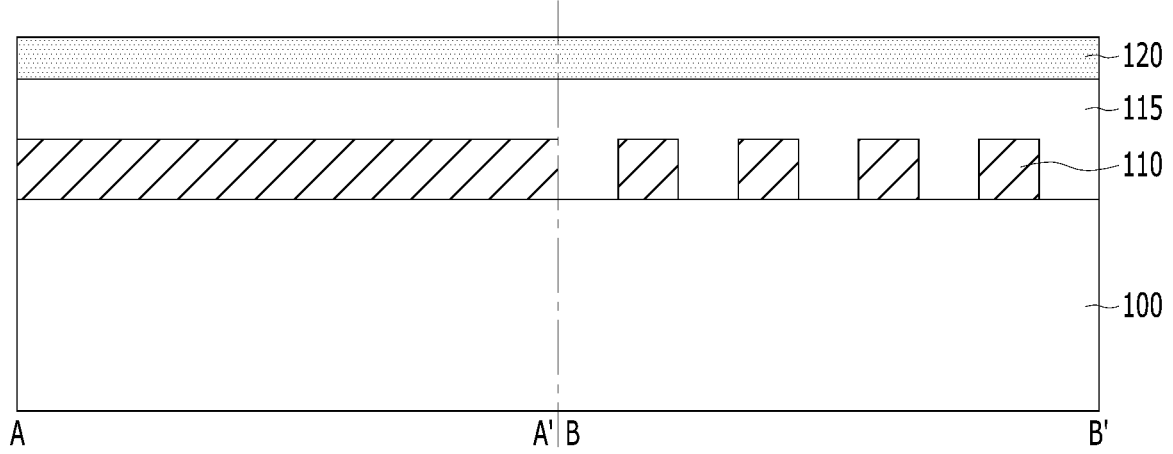

Referring to FIG. 3, a first channel layer 120 may be formed over the first dielectric layer 115.

The first channel layer 120 may be formed through a deposition process and may include diverse materials capable of functioning as a channel of a transistor. For example, the first channel layer 120 may include an oxide semiconductor. Non-limiting examples of the oxide semiconductors may include an oxide of at least one or more metals selected among group-12, 13, and 14 metals, such as zinc (Zn), indium (In), gallium (Ga), tin (Sn), cadmium (Cd), germanium (Ge), and hafnium (Hf). For example, the oxide semiconductor may include In—Sn—Ga—Zn oxide, In—Ga—Zn oxide, In—Sn—Zn oxide, In—Al—Zn oxide, Sn—Ga—Zn oxide, Al—Ga—Zn oxide, Sn—Al—Zn oxide, In—Zn oxide, Sn—Zn oxide, Al—Zn oxide, Zn—Mg oxide, Sn—Mg oxide, In—Mg oxide, In—Ga oxide and the like, or a combination thereof. For example, the first channel layer 120 may include a two-dimensional semiconductor material. The two-dimensional semiconductor material may be a semiconductor material having a two-dimensional crystalline structure, and may include for example graphene, black phosphorous, transition metal dichalcogenide (TMD) and the like.

Figure 4A:
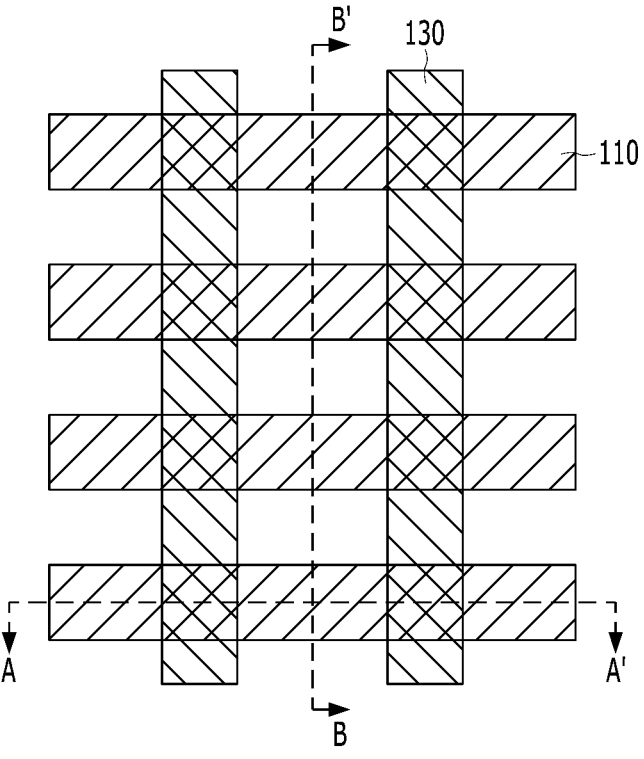
Figure 4B:
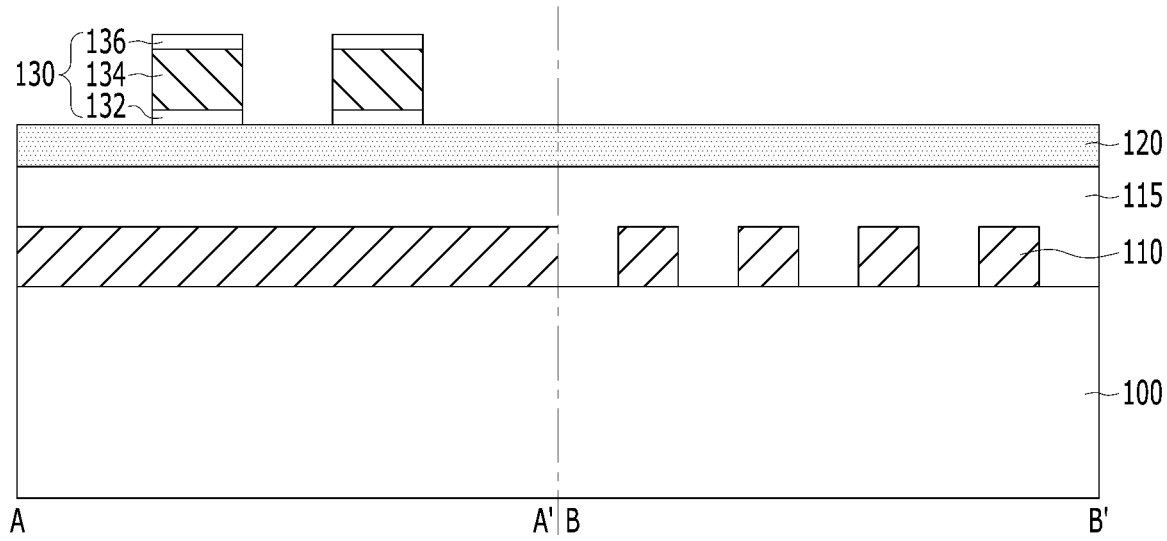

Referring to FIGS. 4A and 4B, a word line structure 130 in which a first gate dielectric layer 132, a word line 134, and a second gate dielectric layer 136 are stacked may be formed over the first channel layer 120.

The word line structure 130 may extend in the second direction to cross the bit line 110, and the word line structures 130 may be arranged to be spaced apart from each other in the first direction. For example, two word line structures 130 may be positioned.

The word line structure 130 may be formed by sequentially depositing a dielectric material for forming the first gate dielectric layer 132 over the first channel layer 120, a conductive material for forming the word line 134, and a dielectric material for forming the second gate dielectric layer 136 and then selectively etching them. In this case, since the first gate dielectric layer 132, the word line 134, and the second gate dielectric layer 136 are patterned together, they may have sidewalls that are aligned with each other in the first direction. However, the present disclosure is not limited thereto as long as the first gate dielectric layer 132 is interposed between the word line 134 and the first channel layer 120. Further, the shape of the first gate dielectric layer 132 may be modified diversely. For example, the first gate dielectric layer 132 may have a planar shape covering the entire surface of the first channel layer 120. Similarly, as long as the second gate dielectric layer 136 is interposed between the word line 134 and a second channel layer (see 150 in FIG. 5), which will be described later, the second gate dielectric layer 136 may have diverse shapes. For example, the second gate dielectric layer 136 may have a planar shape overlapping with the entire surface of the second channel layer.

The dielectric material for forming the first and second gate dielectric layers 132 and 136 may include diverse dielectric materials, such as for example silicon oxide, silicon nitride, silicon oxynitride, and aluminum oxide, or a combination thereof. Also, the dielectric material for forming the first and second gate dielectric layers 132 and 136 may include a high-k material having a higher dielectric constant than silicon oxide, such as for example zirconium oxide, hafnium oxide, lanthanum oxide, tantalum oxide, or titanium oxide, or a combination thereof. The word line 134 may include a metal-containing material, such as for example, a metal, an alloy, a metal compound and the like, such as, aluminum (Al), titanium (Ti), chromium (Cr), cobalt (Co), nickel (Ni), copper (Cu), yttrium (Y), zirconium (Zr), ruthenium (Ru), silver (Ag), tantalum (Ta), tungsten (W) and the like, or a combination thereof.

Figure 5:
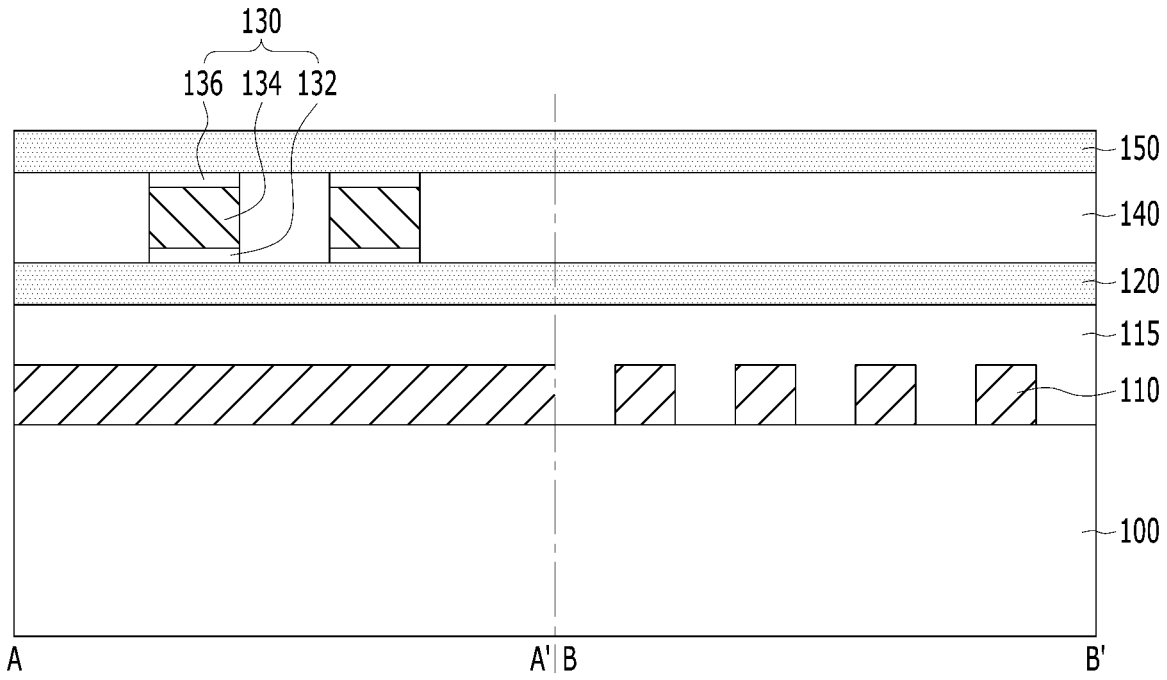

Referring to FIG. 5, a second dielectric layer 140 filling the space between the word line structures 130 (e.g., between adjacent word line structures) may be formed over the first channel layer 120.

The second dielectric layer 140 may include diverse dielectric materials, such as for example silicon oxide, silicon nitride, silicon oxynitride, or a combination thereof. Also, the second dielectric layer 140 may have a top surface planarized with the top surface of the word line structure 130. The second dielectric layer 140 may be formed by depositing a dielectric material having a thickness that may sufficiently cover the word line structure 130 while filling the space between the word line structures 130 over the first channel layer 120, and then performing a planarization process to expose the top surface of the word line structure 130.

Subsequently, a second channel layer 150 may be formed over the second dielectric layer 140 and the second gate dielectric layer 136.

The second channel layer 150 may be formed through a deposition process. The second channel layer 150 may include diverse materials capable of functioning as a channel of a transistor. For example, the second channel layer 150 may include an oxide semiconductor. The second channel layer 150 may include an oxide semiconductor which is the same as that of the first channel layer 120 or may include an oxide semiconductor which is different from that of the first channel layer 120 if needed. Since the first channel layer 120 and the second channel layer 150 may be formed of different materials, there is an advantage in that the characteristics of a transistor may be controlled based on the materials.

Figure 6A:
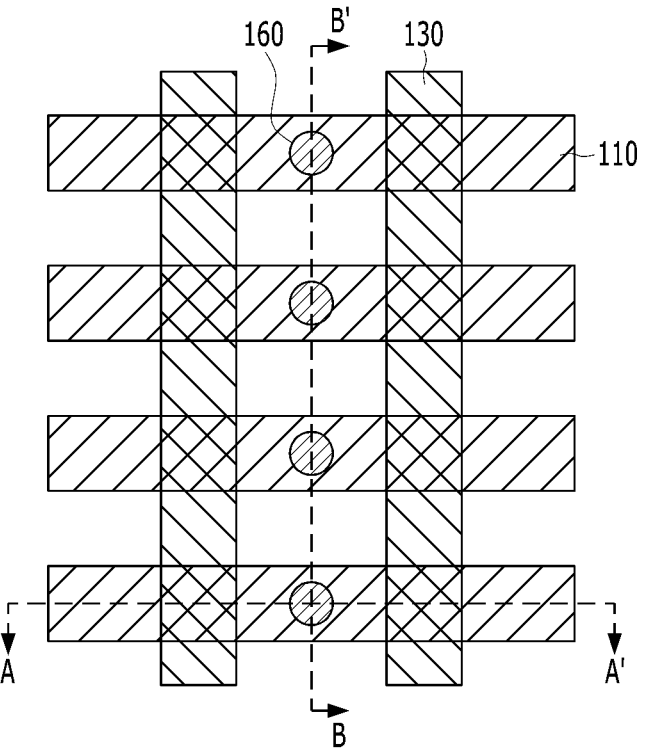
Figure 6B:
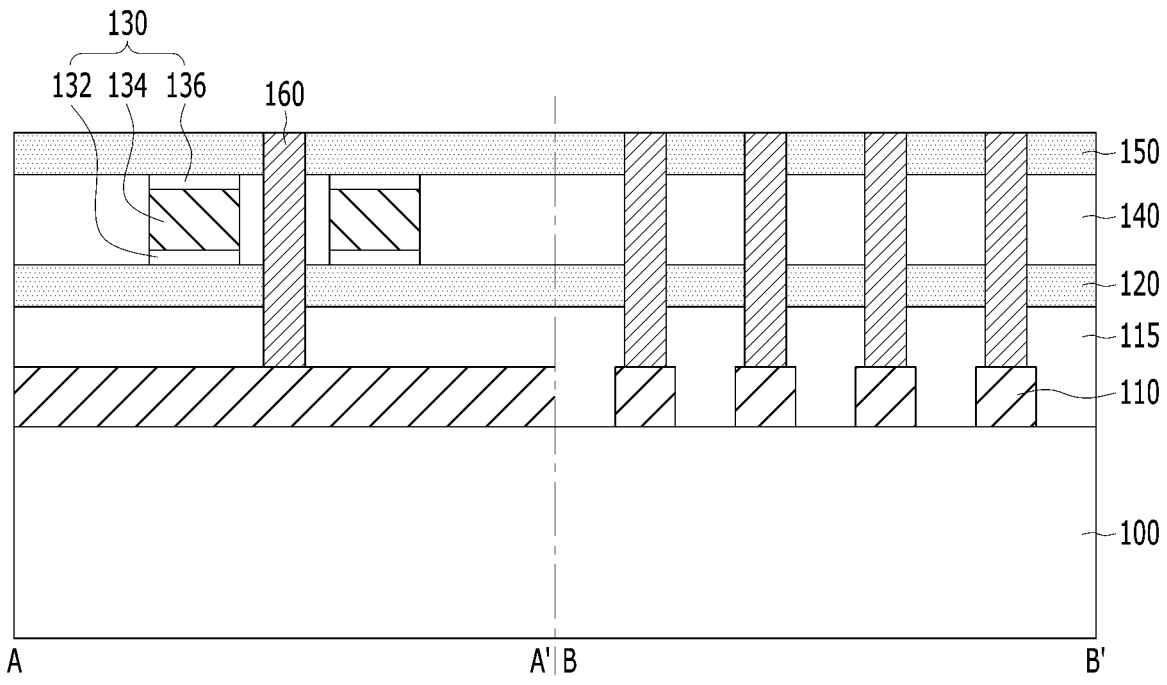

Referring to FIGS. 6A and 6B, a bit line contact 160 that is coupled to the bit line 110 by penetrating the second channel layer 150, the second dielectric layer 140, the first channel layer 120, and the first dielectric layer 115 may be formed.

The bit line contact 160 may have a pillar shape. According to this embodiment of the present disclosure, the bit line contact 160 may be positioned between two word line structures 130 that are arranged in the first direction. However, the present disclosure is not limited thereto, and the bit line contact 160 may be positioned on one side or both sides of the word line structure 130, and may be coupled to the bit line 110 by penetrating the second channel layer 150, the second dielectric layer 140, the first channel the layer 120, and the first dielectric layer 115.

The bit line contact 160 may be formed by forming a mask pattern exposing a portion where the bit line contact 160 is to be formed over the structure of FIG. 5, etching the second channel layer 150, the second dielectric layer 140, the first channel layer 120, and the first dielectric layer 115 by using the mask pattern as an etch barrier so as to form a hole exposing the top surface of the bit line 110, forming a conductive material in a thickness that may sufficiently fill the hole, and performing a planarization process until the top surface of the second channel layer 150 is exposed. The bit line contact 160 may include a metal-containing material, such as for example, a metal, an alloy, a metal compound and the like, such as aluminum (Al), titanium (Ti), chromium (Cr), cobalt (Co), nickel (Ni), copper (Cu), yttrium (Y), zirconium (Zr), ruthenium (Ru), silver (Ag), tantalum (Ta), tungsten (W) and the like, or a combination thereof.

Figure 7A:
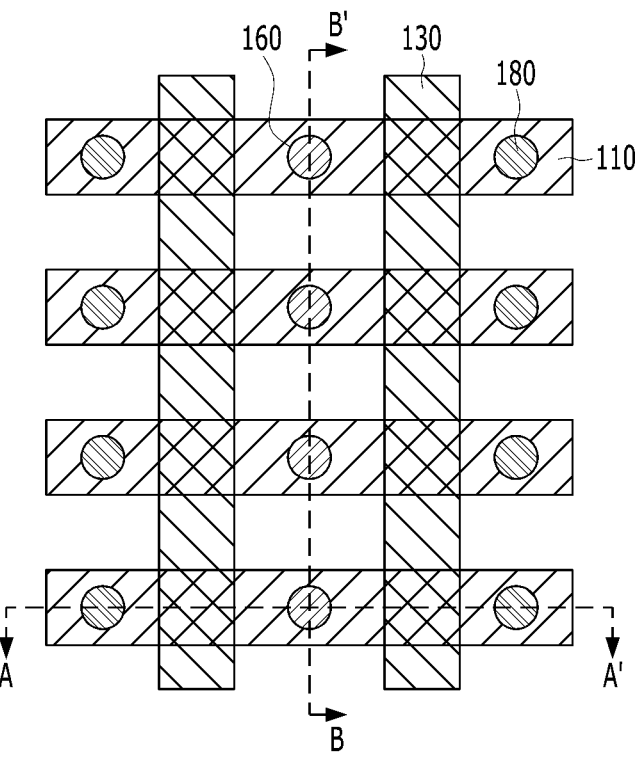
Figure 7B:
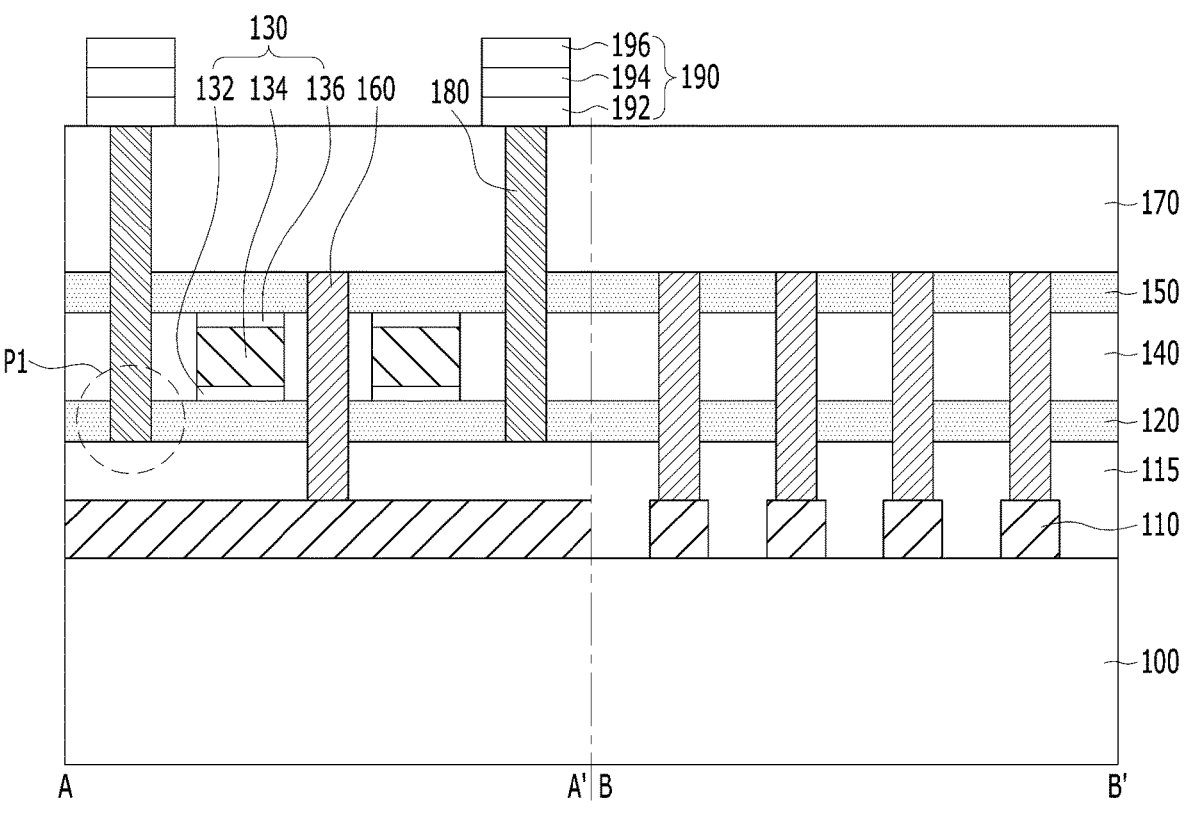

Referring to FIGS. 7A and 7B, a third dielectric layer 170 may be formed on the process result of FIGS. 6A and 6B.

Subsequently, a storage node contact 180 may be formed to penetrate the third dielectric layer 170, the second channel layer 150, the second dielectric layer 140, and the first channel layer 120.

The storage node contact 180 may have a pillar shape. According to this embodiment of the present disclosure, the storage node contacts 180 may be positioned on both sides of each of the two word line structures 130 that are arranged in the first direction. However, the present disclosure is not limited thereto, and the storage node contacts 180 may be positioned on a second side where the bit line contact 160 is not positioned among both sides of each of the word line structures 130 and coupled to the first channel layer 120 by penetrating the third dielectric layer 170, the second channel layer 150, and the second dielectric layer 140.

The storage node contact 180 may be formed by forming a mask pattern exposing a portion where the storage node contact 180 is to be formed over the third dielectric layer 170, etching the third dielectric layer 170, the second channel layer 150, the second dielectric layer 140, and the first channel layer 120 by using the mask pattern as an etch barrier so as to form a hole exposing the top surface of the first dielectric layer 115, forming a conductive material in a thickness that may sufficiently fill the hole, and performing a planarization process until the top surface of the third dielectric layer 170 is exposed. The storage node contact 180 may include a metal-containing material, such as for example, a metal, an alloy, a metal compound and the like, such as aluminum (Al), titanium (Ti), chromium (Cr), cobalt (Co), nickel (Ni), copper (Cu), yttrium (Y), zirconium (Zr), ruthenium (Ru), silver (Ag), tantalum (Ta), tungsten (W) and the like, or a combination thereof.

Subsequently, a data storage element 190 coupled to the storage node contact 180 may be formed over the storage node contact 180. For example, the data storage element 190 may include a capacitor including a bottom electrode 192, a top electrode 196, and a dielectric material 194 between the bottom electrode 192 and the top electrode 196. For example, the data storage element 190 may include a variable resistance element that stores different data by switching between different resistance states according to an applied voltage or current. The variable resistance element may include diverse materials used in a resistive random access memory (RRAM), a phase-change random access memory (PRAM), a ferroelectric random access memory (FRAM), a magnetoresistive random access memory (MRAM) and the like. The diverse materials in these memory elements may include for example, transition metal oxides, metal oxides such as perovskite-based materials and the like, phase-change materials such chalcogenide-based materials, ferroelectric materials, ferromagnetic materials and the like, or a combination thereof.

As a result, the semiconductor device as illustrated in FIGS. 7A and 7B may be fabricated.

Referring back to FIGS. 7A and 7B, the semiconductor device according to one embodiment of the present disclosure may include a substrate 100, a plurality of bit lines 110 positioned over the substrate 100 and extending in the first direction, a first dielectric layer 115 covering the bit line 110 while filling the space between the bit lines 110, a first channel layer 120 positioned over the first dielectric layer 115, a plurality of word line structures 130 positioned over the first channel layer 120 and extending in the second direction, a second dielectric layer 140 having a top surface planarized with the top surface of the word line structure 130 while filling the space between the word line structures 130, a second channel layer 150 positioned over the word line structure 130 and the second dielectric layer 140, a bit line contact 160 coupled to the bit line 110 by penetrating the second channel layer 150, the second dielectric layer 140, the first channel layer 120, and the first dielectric layer 115, a third dielectric layer 170 covering the bit line contact 160 and the second channel layer 150, a storage node contact 180 penetrating the third dielectric layer 170, the second channel layer 150, the second dielectric layer 140, and the first channel layer 120, and a data storage element 190 coupled to the storage node contact 180 over the storage node contact 180.

The first channel layer 120 and the second channel layer 150 may be independently formed through a deposition process and may include an oxide semiconductor or a two-dimensional semiconductor (as described above).

The bottom surface of the bit line contact 160 may directly contact the top surface of the bit line 110, and the top surface of the bit line contact 160 may be positioned at substantially the same height as the top surface of the second channel layer 150. A sidewall of a portion of the bit line contact 160 penetrating the second channel layer 150 may be surrounded by the second channel layer 150, and a sidewall of a portion of the bit line contact 160 penetrating the first channel layer 120 may be surrounded by the first channel layer 120. In this case, since the contact area between the bit line contact 160 and the first channel layer 120 and the contact area between the bit line contact 160 and the second channel layer 150 are increased, the contact resistance between the bit line contact 160 and the first channel layer 120 and the contact resistance between the bit line contact 160 and the second channel layer 150 may be decreased, which is advantageous.

The top surface of the storage node contact 180 may be positioned at substantially the same height as the top surface of the third dielectric layer 170, and the bottom surface of the storage node contact 180 may directly contact the first dielectric layer 115. In this case, a sidewall of a portion of the storage node contact 180 penetrating the second channel layer 150 may be surrounded by the second channel layer 150, and a sidewall of a portion of the storage node contact 180 penetrating the first channel layer 120 may be surrounded by the first channel layer 120. In this case, since the contact area between the storage node contact 180 and the first channel layer 120 and the contact area between the storage node contact 180 and the second channel layer 150 are increased, the contact resistance between the storage node contact 180 and the first channel layer 120 and the contact resistance between the storage node contact 180 and the second channel layer 150 may be decreased, which is advantageous.

One word line structure 130 and the first and second channel layers 120 and 150 respectively positioned below and over the word line structure 130 may form one transistor. In other words, a dual channel transistor may be realized. The word line structure 130 may function as a gate of the transistor. The bit line contact 160 may be coupled to the bit line 110 while being coupled to the first and second channel layers 120 and 150 at a first side of the word line structure 130. The storage node contact 180 may be coupled to the first and second channel layers 120 and 150 on a second side of the word line structure 130.

The above-described semiconductor device and method for fabricating the same may have the following advantages.

Since a channel layer that may be formed by a deposition process, for example, an oxide semiconductor and/or a two-dimensional semiconductor is used instead of forming a channel layer by ion implantation into a conventional semiconductor substrate, a plurality of transistors may be vertically stacked. Thus, a highly integrated semiconductor device may be obtained.

Also, since a buried bit line structure buried in a dielectric layer below the word line is used, it is relatively easy to secure a distance between the bit line and the word line even when the area of the semiconductor device is reduced.

Also, by disposing two channel layers below and over the word line to realize a dual channel transistor, it is possible to improve the operating characteristics of a transistor, such as securing sufficient current of the transistor. In this case, since the two channel layers may be independently deposited, they may be formed of different materials. Accordingly, the operating characteristics of a transistor may be further improved by adjusting the two channel layers with appropriate materials in consideration of the characteristics of the transistor.

Also, since the bit line contact and the storage node contact are formed to pass through the channel layer, the contact area between the bit line contact and the storage node contact and the channel layer may be increased and the contact resistance may be reduced accordingly.

Furthermore, since an oxide semiconductor and a two-dimensional semiconductor may be used as the channel layer, both of the advantages of using the oxide semiconductor channel and using the two-dimensional semiconductor may be secured. For example, when an oxide semiconductor is used as a channel layer, low off current and high carrier mobility may be secured. Also, for example, in the case of using a two-dimensional semiconductor as the channel layer, it is possible to secure a reduced thickness and high carrier mobility.

Meanwhile, according to the above embodiments of the present invention, a case where the storage node contact 180 penetrates the entire first channel layer 120 so that the bottom surface of the storage node contact 180 contacts the first dielectric layer 115 is described (see part P1 in FIG. 7B). However, the present disclosure is not limited thereto, and the height of the bottom surface of the storage node contact 180 may be adjusted to reside at a different level relative to the first channel layer 120 as long as the storage node contact 180 contacts and is coupled to the first channel layer 120. This embodiment will be described with reference to FIGS. 8A and 8B below.

Figure 8A:
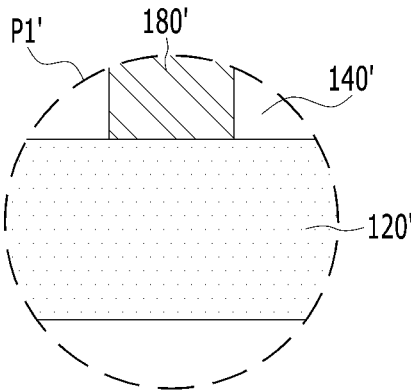
FIG. 8A illustrates a semiconductor device in accordance with another embodiment of the present disclosure.

FIG. 8A illustrates a semiconductor device in accordance with another embodiment of the present disclosure, and FIG. 8A illustrates only a portion corresponding to the part P1 of FIG. 7B (see part P1').

Referring to FIG. 8A, the bottom surface of the storage node contact 180' may be positioned at substantially the same height as the top surface of the first channel layer 120' while contacting the top surface of the first channel layer 120'. When a hole for forming the storage node contact 180' is formed and an etching process is performed to stop at a moment when the top surface of the first channel layer 120' is exposed, the storage node contact 180' having this shape may be obtained.

Figure 8B:
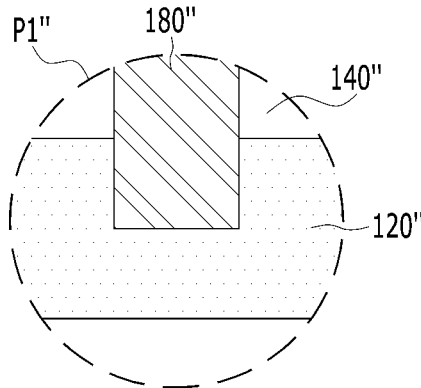
FIG. 8B illustrates a semiconductor device in accordance with another embodiment of the present disclosure.

FIG. 8B illustrates a semiconductor device in accordance with another embodiment of the present disclosure, and FIG. 8B illustrates only a portion corresponding to the part P1 of FIG. 7B (refer to the part P1'').

Referring to FIG. 8B, a storage node contact 180'' may penetrate only a portion of a first channel layer 120''. Accordingly, the bottom surface of the storage node contact 180'' may be positioned below the top surface of the first channel layer 120'' and over the bottom surface of the first channel layer 120''. When the hole for forming the storage node contact 180'' is formed, the etching may stop at the first channel layer 120'', but when over-etching is performed, the storage node contact 180'' having this shape may be obtained.

Even according to the embodiments of FIGS. 8A and 8B, the storage node contact 180' and 180'' may penetrate the second channel layer 150, and a portion of a sidewall of the storage node contact 180' and 180'' may be surrounded by the second channel layer 150. Therefore, the driving capability of a transistor may be improved, compared to a case where the storage node contact simply contacts the top surface of the channel layer 120'.

FIGS. 9 to 12 are cross-sectional views illustrating a semiconductor device and a method for fabricating the same in accordance with other embodiments of the present disclosure. Description will be made focusing on the differences from the foregoing embodiments, and detailed descriptions on components that are substantially the same will be omitted.

First, the fabrication method will be described.

Figure 9:
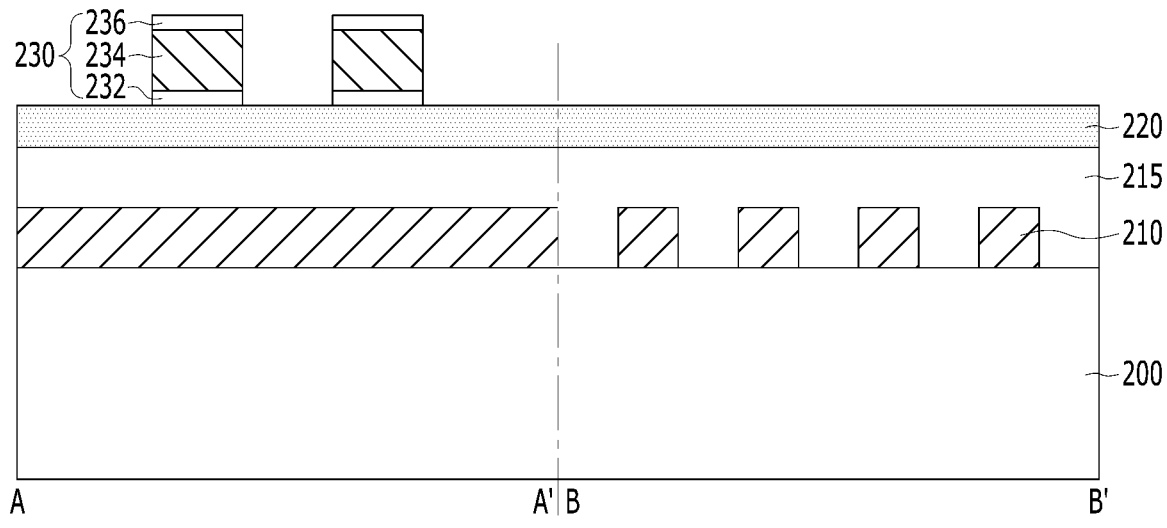
FIGS. 9 to 12 are cross-sectional views illustrating a semiconductor device and a method for fabricating the same in accordance with other embodiments of the present disclosure.

Referring to FIG. 9, a bit line 210, a first dielectric layer 215, and a first channel layer 220 may be formed over a substrate 200.

Subsequently, a word line structure 230 where a first gate dielectric layer 232, a word line 234, and a hard mask 236 are stacked may be formed over the first channel layer 220.

The word line structure 230 may be formed by sequentially depositing a dielectric material for forming the first gate dielectric layer 232, a conductive material for forming the word line 234, and a dielectric material for forming a hard mask 236 over the first channel layer 220 and selectively etching them. In this case, since the first gate dielectric layer 232, the word line 234, and the hard mask 236 are patterned together, they may have sidewalls that are aligned with each other in the first direction. However, the present disclosure is not limited thereto as long as the first gate dielectric layer 232 is interposed between the word line 234 and the first channel layer 220. The shape of the first gate dielectric layer 232 may be modified diversely. On the other hand, the hard mask 236 may function as an etch barrier during an etching process for forming the word line 234 and the first gate dielectric layer 232, and the hard mask 236 may have a sidewall that is aligned with the word line 234 in the first direction. The hard mask 236 may include a dielectric material having an etch selectivity with respect to the word line 234 and the first gate dielectric layer 232. For example, the hard mask 236 may include silicon nitride.

Figure 10:
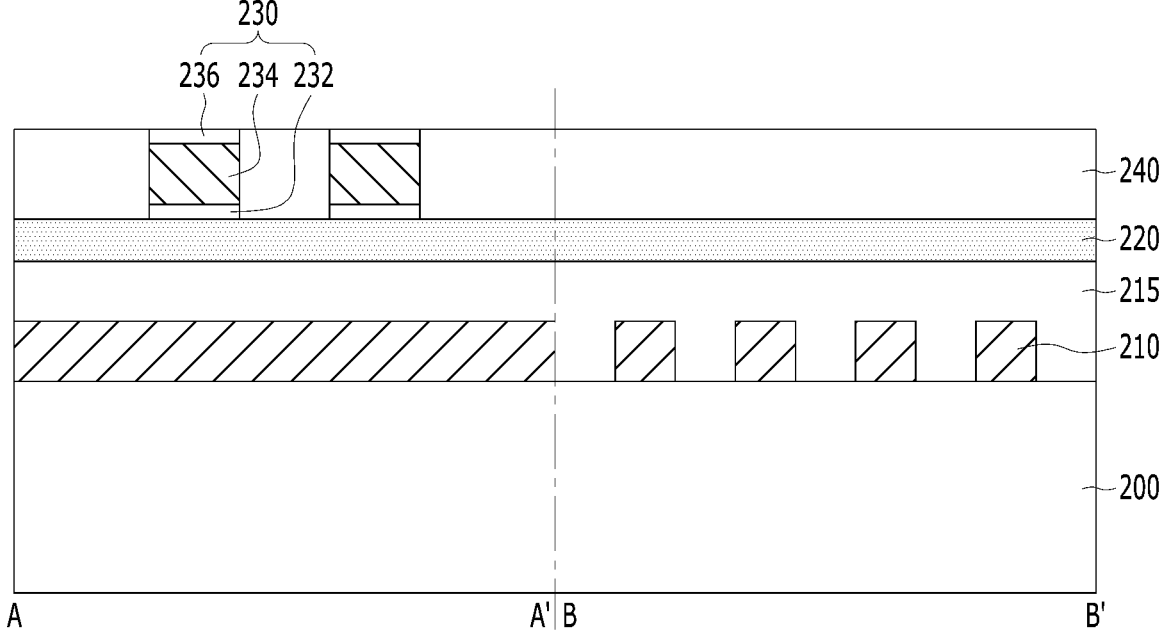

Referring to FIG. 10, a second dielectric layer 240 may be formed over the first channel layer 220 to fill the space between the word line structures 230.

Figure 11:
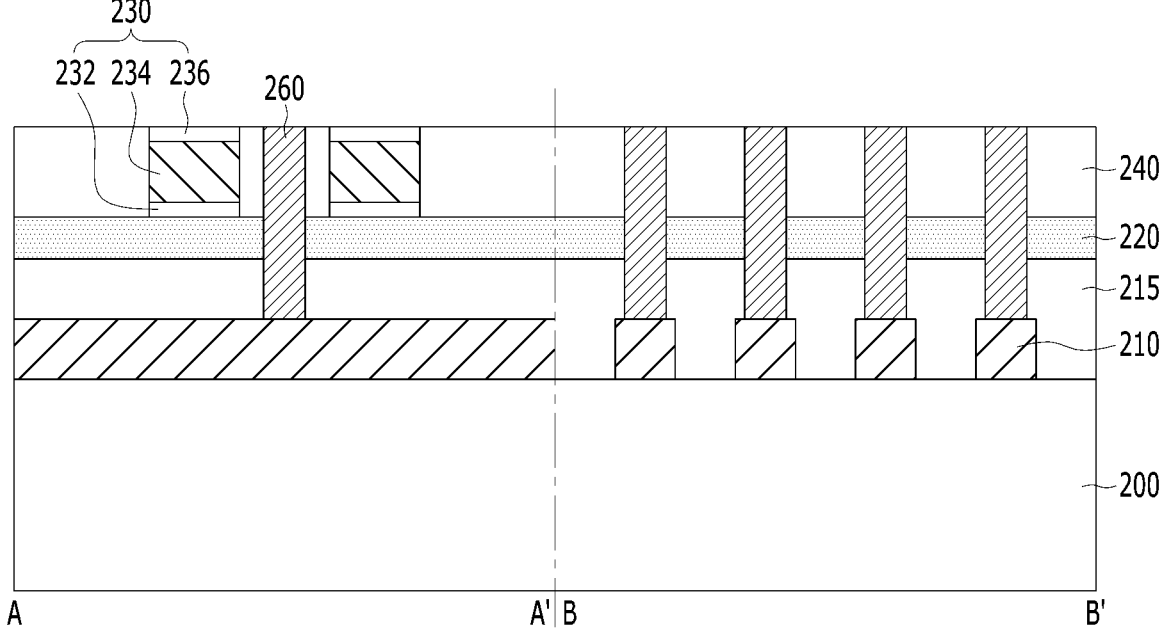

Referring to FIG. 11, a bit line contact 260 penetrating the second dielectric layer 240, the first channel layer 220, and the first dielectric layer 215 may be formed to be coupled to the bit line 210.

Figure 12:
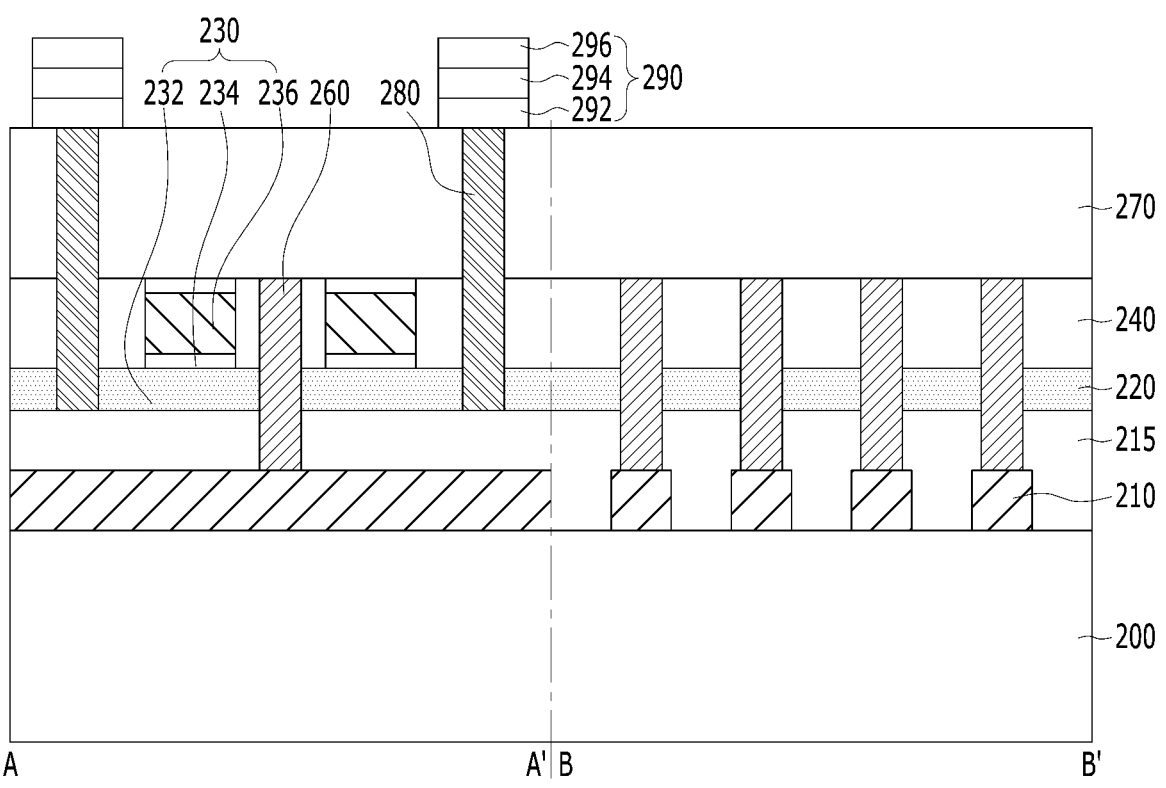

Referring to FIG. 12, a third dielectric layer 270 may be formed over the process result of FIG. 11.

Subsequently, the storage node contact 280 may be formed to penetrate the third dielectric layer 270, the second dielectric layer 240, and the first channel layer 220.

Subsequently, a data storage element 290 coupled to the storage node contact 280 may be formed over the storage node contact 280. For example, the data storage element 290 may include a capacitor including a bottom electrode 292, a top electrode 296, and a dielectric material 294 interposed between the bottom electrode 292 and the top electrode 296. For example, the data storage element 290 may include a variable resistance element.

As a result, the semiconductor device as shown in FIG. 12 may be fabricated.

Referring again to FIG. 12, the semiconductor device according to one embodiment of the present disclosure may include a substrate 200, a plurality of bit lines 210 positioned over the substrate 200 and extending in the first direction, a first dielectric layer 215 covering the bit line 210 while filling the space between the bit lines 210, a first channel layer 220 positioned over the first dielectric layer 215, a plurality of word line structures 230 positioned over the first channel layer 220 and extending in the second direction, a second dielectric layer 240 having a top surface planarized with the top surface of the word line structure 230 while filling the space between the word line structures 230, a bit line contact 260 coupled to the bit line 210 by penetrating the second dielectric layer 240, the first channel layer 220 and the first dielectric layer 215, a third dielectric layer 270 covering the bit line contact 260, the word line structures 230, and the second dielectric layer 240, and a storage node contact 280 penetrating the third dielectric layer 270, the second dielectric layer 240, and the first channel layer 220, and a data storage element 290 coupled to the storage node contact 280 over the storage node contact 280. Unlike the semiconductor devices shown in FIGS. 7A and 7B, the semiconductor device according to this embodiment of the present disclosure may include a single-channel transistor.

Meanwhile, although the embodiment of the present disclosure described the case where the storage node contact 280 penetrates the entire first channel layer 220 such that the bottom surface of the storage node contact 280 contacts the first dielectric layer 215, the present disclosure is not limited thereto. On the premise that the storage node contact 280 contacts and is coupled to the first channel layer 220, the bottom part of the storage node contact 280 may have a height that is equal to the height of the first channel layer 220 or may have a height between the top surface of the second channel layer 220 and the bottom surface of the second channel layer 220.

According to one embodiment of the present disclosure, provided is a semiconductor device capable of improving the degree of integration and securing operating characteristics of a transistor.

While the present disclosure has been described with respect to the specific embodiments, it will be apparent to those skilled in the art that various changes and modifications may be made without departing from the scope of the invention.

What is claimed is:

1. A semiconductor device, comprising:
a substrate;
a bit line positioned over the substrate and extending in a first direction;
a first dielectric layer covering the bit line;
a first channel layer positioned over the first dielectric layer;
at least one word line positioned over the first channel layer and extending in a second direction crossing the first direction;
a second dielectric layer at least filling a space between adjacent word lines;
a first contact coupled to the bit line by penetrating the second dielectric layer, the first channel layer, and the first dielectric layer;
a third dielectric layer positioned over the word line, the second dielectric layer, and the first contact; and
a second contact coupled to the first channel layer by penetrating the third dielectric layer and the second dielectric layer.

2. The semiconductor device of claim 1, wherein the second contact penetrates at least a portion of the first channel layer.

3. The semiconductor device of claim 1, wherein the first channel layer includes one or more of an oxide semiconductor and a two-dimensional semiconductor.

4. The semiconductor device of claim 1, further comprising:
a first gate dielectric layer interposed between the word line and the first channel layer.

5. The semiconductor device of claim 4, wherein the first gate dielectric layer has a sidewall aligned with the word line.

6. The semiconductor device of claim 1, further comprising:
a hard mask interposed between the word line and the third dielectric layer.

7. The semiconductor device of claim 6, wherein the hard mask has a sidewall aligned with the word line.

8. The semiconductor device of claim 1, wherein the at least one word line includes two word lines arranged in the first direction,
the second contact coupled to the first channel layer includes a plurality of second contacts,
the first contact coupled to the bit line is positioned between the two word lines, and
the second contacts are positioned on both sides of the two word lines, respectively.

9. The semiconductor device of claim 1, wherein a top surface of the first contact is positioned at a same height as a top surface of the second dielectric layer.

10. The semiconductor device of claim 1, wherein a top surface of the second contact is positioned at a same height as a top surface of the third dielectric layer.

11. A semiconductor device, comprising:
a substrate;
a bit line positioned over the substrate and extending in a first direction;
a first dielectric layer covering the bit line;
a first channel layer positioned over the first dielectric layer;

at least one word line positioned over the first channel layer and extending in a second direction crossing the first direction;

a second dielectric layer at least filling a space between adjacent word lines;

a second channel layer positioned over the word line and the second dielectric layer;

a first contact coupled to the bit line by penetrating the second channel layer, the second dielectric layer, the first channel layer, and the first dielectric layer;

a third dielectric layer positioned over the second channel layer and the first contact; and a second contact coupled to the first channel layer by penetrating the third dielectric layer, the second channel layer, and the second dielectric layer.

12. The semiconductor device of claim 11, wherein the second contact penetrates at least a portion of the first channel layer.

13. The semiconductor device of claim 11, wherein each of the first channel layer and the second channel layer independently includes one or more of an oxide semiconductor and a two-dimensional semiconductor.

14. The semiconductor device of claim 11, wherein the first channel layer and the second channel layer include different materials.

15. The semiconductor device of claim 11, further comprising:

a first gate dielectric layer interposed between the word line and the first channel layer; and a second gate dielectric layer interposed between the word line and the second channel layer.

16. The semiconductor device of claim 15, wherein the first gate dielectric layer has a sidewall that is aligned with the word line.

17. The semiconductor device of claim 15, wherein the second gate dielectric layer has a sidewall that is aligned with the word line.

18. The semiconductor device of claim 11, wherein the at least one word line includes two word lines arranged in the first direction, the second contact coupled to the first channel layer includes a plurality of second contacts, the first contact coupled to the bit line is positioned between the two word lines, and the second contacts are positioned on both sides of the two word lines, respectively.

19. The semiconductor device of claim 11, wherein a top surface of the first contact is positioned at a same height as a top surface of the second channel layer.

20. The semiconductor device of claim 11, wherein a top surface of the second contact is positioned at a same height as a top surface of the third dielectric layer.

\* \* \* \* \*